United States Patent
Dussarrat et al.

(10) Patent No.: US 8,932,674 B2
(45) Date of Patent: Jan. 13, 2015

(54) VAPOR DEPOSITION METHODS OF SICOH LOW-K FILMS

(75) Inventors: Christian Dussarrat, Tokyo (JP); François Doniat, Greenville, DE (US); Curtis Anderson, Downingtown, PA (US); James J. F. McAndrew, Chadds Ford, PA (US)

(73) Assignee: American Air Liquide, Inc., Fremont, CA (US)

( * ) Notice: Subject to any disclaimer, the term of this patent is extended or adjusted under 35 U.S.C. 154(b) by 152 days.

(21) Appl. No.: 13/576,016

(22) PCT Filed: Feb. 17, 2011

(86) PCT No.: PCT/US2011/025234
§ 371 (c)(1),
(2), (4) Date: Nov. 5, 2012

(87) PCT Pub. No.: WO2011/103282
PCT Pub. Date: Aug. 25, 2011

(65) Prior Publication Data
US 2013/0042790 A1   Feb. 21, 2013

Related U.S. Application Data

(60) Provisional application No. 61/305,491, filed on Feb. 17, 2010.

(51) Int. Cl.
| | | |
|---|---|---|
| C23C 16/30 | (2006.01) | |
| C23C 16/44 | (2006.01) | |
| C23C 16/40 | (2006.01) | |
| H01L 21/02 | (2006.01) | |
| C23C 16/56 | (2006.01) | |

(52) U.S. Cl.
CPC ........ H01L 21/02126 (2013.01); C23C 16/401 (2013.01); C23C 16/30 (2013.01); H01L 21/02274 (2013.01); C23C 16/56 (2013.01); H01L 21/02203 (2013.01); H01L 21/02211 (2013.01); H01L 21/02214 (2013.01)
USPC ........... 427/249.15; 427/255.29; 427/255.393

(58) Field of Classification Search
USPC .............. 427/249.1, 249.15, 255.29, 255.393
See application file for complete search history.

(56) References Cited

U.S. PATENT DOCUMENTS

| | | | |
|---|---|---|---|
| 5,296,624 A | 3/1994 | Larson et al. | |
| 5,989,998 A | 11/1999 | Sugahara et al. | |
| 6,159,871 A | 12/2000 | Loboda et al. | |
| 6,312,793 B1 | 11/2001 | Grill et al. | |
| 6,410,151 B1 | 6/2002 | Kurosawa et al. | |
| 6,479,110 B2 | 11/2002 | Grill et al. | |
| 6,558,747 B2 | 5/2003 | Nakata et al. | |
| 6,583,048 B1 | 6/2003 | Vincent et al. | |
| 6,756,323 B2 | 6/2004 | Grill et al. | |
| 6,797,643 B2 | 9/2004 | Rocha-Alvarez et al. | |
| 6,846,515 B2 | 1/2005 | Vrtis et al. | |
| 6,953,984 B2 | 10/2005 | Grill et al. | |
| 7,030,468 B2 | 4/2006 | Gates et al. | |
| 7,049,247 B2 | 5/2006 | Gates et al. | |
| 7,049,427 B2 | 5/2006 | Hanummappa et al. | |
| 7,087,271 B2 | 8/2006 | Rhee et al. | |
| 7,202,564 B2 | 4/2007 | Nguyen et al. | |
| 7,229,934 B2 | 6/2007 | Dubois et al. | |
| 7,241,704 B1 | 7/2007 | Wu et al. | |
| 7,256,139 B2 | 8/2007 | Moghadam et al. | |
| 7,282,458 B2 | 10/2007 | Gates et al. | |
| 7,288,292 B2 | 10/2007 | Gates et al. | |
| 7,312,524 B2 | 12/2007 | Gates et al. | |
| 7,345,000 B2 | 3/2008 | Kevwitch et al. | |
| 7,381,659 B2 | 6/2008 | Nguyen et al. | |
| 7,384,471 B2 | 6/2008 | Vrtis et al. | |
| 7,390,537 B1 | 6/2008 | Wu et al. | |
| 7,399,715 B2 | 7/2008 | Tsuchiya et al. | |
| 7,479,306 B2 | 1/2009 | Edelstein et al. | |
| 7,491,658 B2 | 2/2009 | Nguyen et al. | |
| 7,500,397 B2 | 3/2009 | Weigel et al. | |
| 7,521,377 B2 | 4/2009 | Gates et al. | |
| 7,579,286 B2 | 8/2009 | Tabuchi | |
| 2004/0241463 A1 | 12/2004 | Vincent et al. | |
| 2005/0113472 A1 | 5/2005 | Fillmore et al. | |
| 2005/0194619 A1 | 9/2005 | Edelstein et al. | |
| 2005/0196974 A1 | 9/2005 | Weigel et al. | |
| 2005/0260420 A1 | 11/2005 | Collins et al. | |
| 2006/0079099 A1 | 4/2006 | Nguyen et al. | |
| 2006/0134897 A1 | 6/2006 | Borovik et al. | |
| 2006/0151884 A1 | 7/2006 | Hara et al. | |
| 2006/0165891 A1 | 7/2006 | Edelstein et al. | |
| 2007/0057235 A1 | 3/2007 | Teff et al. | |

(Continued)

FOREIGN PATENT DOCUMENTS

| | | |
|---|---|---|
| EP | 2 053 107 | 4/2009 |
| EP | 2 116 632 | 11/2009 |

(Continued)

OTHER PUBLICATIONS

Doniat, Francois, et al., "Development of low-k precursors for next generation IC manufacturing". Microelectronic Engineering, 92 (2012) 34-37.*

Air Liquide, "Development of low-k precursors for next generation IC manufacturing," poster session of Advanced Metallization Conference 2010, Oct. 5-7, 2010, Albany, New York, accessed at http://www.sematech.org/meetings/archives/3d/8964/index.htm, 1 pg.

Anonymous, "Low-k precursors adapted for incorporation of porosity," http://www.ip.com, No. IPCOM000185211D, published Jul. 15, 2009.

Doniat, F. et al., "Development of low-k precursors for next generation IC manufacturing," Microelectronic Engineering 92 (2012), pp. 34-37.

Dubois, G. et al., "Molecular network reinforcement of sol-gel glasses," Advanced Materials 19 (22), Nov. 2007, pp. 3989-3994.

Gates, S. et al., "Integration of compatible porous SiCOH dielectrics from 45 to 22 nm," Advanced Metallization Conference Proceedings 2008, pp. 68-69.

(Continued)

*Primary Examiner* — Bret Chen
(74) *Attorney, Agent, or Firm* — Patricia E. McQueeney

(57) ABSTRACT

Disclosed are precursors that are adapted to deposit SiCOH films with dielectric constant and Young's Modulus suitable for future generation dielectric films.

17 Claims, No Drawings

(56) References Cited

U.S. PATENT DOCUMENTS

| | | |
|---|---|---|
| 2008/0048148 A1 | 2/2008 | Borovik et al. |
| 2008/0241748 A1 | 10/2008 | Motalebbi et al. |
| 2008/0265381 A1 | 10/2008 | Afzali-Ardakani et al. |
| 2008/0268177 A1* | 10/2008 | Vrtis et al. .................... 427/585 |
| 2008/0283972 A1 | 11/2008 | Muh et al. |
| 2009/0017231 A1 | 1/2009 | Yim et al. |
| 2009/0017639 A1 | 1/2009 | Yim et al. |
| 2009/0093132 A1 | 4/2009 | Xu et al. |
| 2009/0136667 A1 | 5/2009 | Deval et al. |
| 2009/0181178 A1 | 7/2009 | Edelstein et al. |
| 2009/0299086 A1 | 12/2009 | Nobe et al. |
| 2010/0052115 A1* | 3/2010 | McAndrew et al. .......... 257/632 |
| 2010/0143580 A1 | 6/2010 | McAndrew et al. |
| 2010/0174103 A1 | 7/2010 | Nakagawa et al. |
| 2010/0233829 A1* | 9/2010 | McAndrew et al. .............. 438/4 |
| 2010/0261925 A1 | 10/2010 | Nakagawa et al. |
| 2012/0114544 A1 | 5/2012 | Jung et al. |

FOREIGN PATENT DOCUMENTS

| | | |
|---|---|---|
| EP | 2 264 219 | 12/2010 |
| JP | 03 024093 | 2/1991 |
| JP | 2004 288979 | 10/2004 |
| JP | 2006 040936 | 2/2006 |
| JP | 2006 111738 | 4/2006 |
| JP | 2006 216541 | 8/2006 |
| JP | 2006 241305 | 9/2006 |
| JP | 2007 221039 | 8/2007 |
| JP | 2007 318067 | 12/2007 |
| JP | 2009 132855 | 6/2009 |
| JP | 2009 191108 | 8/2009 |
| JP | 2009 194037 | 8/2009 |
| JP | 2009 194075 | 8/2009 |
| JP | 4379637 | 10/2009 |
| JP | 2010 006795 | 1/2010 |
| KR | 10 2009 0115915 | 11/2009 |
| WO | WO 2004 049422 | 6/2004 |
| WO | WO 2004 083495 | 9/2004 |
| WO | WO 2005 080629 | 9/2005 |
| WO | WO 2006 136741 | 12/2006 |
| WO | WO 2007 113104 | 10/2007 |
| WO | WO 2008 020592 | 2/2008 |
| WO | WO 2008 099811 | 8/2008 |
| WO | WO 2009 008424 | 1/2009 |
| WO | WO 2009 009267 | 1/2009 |
| WO | WO 2009 119583 | 10/2009 |
| WO | WO 2011 008009 | 1/2011 |

OTHER PUBLICATIONS

Hemida, A.T. et al., "Synthesis and characterization of new precursors to nearly stoichiometric SiC ceramics," Journal of Materials Science 32 (1997), pp. 3485-3490.

"The International Technology Roadmap for Semiconductors", 2007, *Interconnect*.

Kim, S. et al., "Organosilicate spin-on glasses, I. Effect of chemical modification on mechanical properties," Journal of the Electrochemical Society, 151 (3), 2004, pp. F37-F44.

Loy, D.A. et al, "Bridged polysilsesquioxanes. Highly porous hybrid organic-inorganic materials", Chem Rev (1995) 95, pp. 1431-1442.

Lu, Y. et al., "Evaporation-induced self-assembly of hybrid bridged silsesquioxane film and particulate mesophases with integral organic functionality," J. Am. Chem. Soc., 122 (22), 2000, pp. 5258-5261.

Oh, T. et al., "Chemical shift determined according to flow rate ratio $O_2$/BTMSM by Fourier Transform Infrared spectra and x-ray photoelectron spectroscopy," Japanese Journal of Applied Physics, 42, 2003, pp. 6292-6295.

O'Neill, M. et al., "Low-k materials by design," Semiconductor International, Jun. 1, 2002, http://www.highbeam.com/doc/1G1-87353505.html.

"Silicon compounds: silanes and silicones," $2^{nd}$ ed., Barry Arkles and Gerald Larson, eds., Gelest, Inc., Morrisville, PA, 2008, p. 484.

Sugahara, S. et al., "Preparation and characterization of low-k silica film incorporated with methylene groups," Journal of the Electromechanical Society, 148, (6), 2001, pp. F120-F126.

Sugahara, S. et al., "A proposed organic-silica film for inter-metal-dielectric applications," Japan Journal of Applied Physics, 38, 1999, pp. 1428-1432.

International Search Report and Written Opinion for corresponding PCT/US2011/025234, Nov. 21, 2011.

Austrian Search Report and Written Opinion for corresponding SG 201205981-2, Mar. 7, 2014.

Kim, H.J. et al., "Characterization of low-dielectric-constant SiOC thin films deposited by PECVD for interlayer dielectrics of multilevel interconnection," Surface and Coatings Technology 171 (2003) 39-45.

Kim, H.J. et al., "Origin of low dielectric consant of carbon-incorporated silicon oxide film deposited by plasma enhanced chemical vapor deposition," Journal of Applied Physics 90 (2001) 2469-2473.

Oh, T. et al., "Bonding structure of the cross-link in organosilicate films using $O_2$/BTMSM precursors," Japanese Journal of Applied Physics 42 (2003) 1517-1520.

Oh, T. "Generation of SiCO films by the thermal induction," Japanese Journal of Applied Physics 44(3) (2005) 1409-1413.

* cited by examiner

VAPOR DEPOSITION METHODS OF SICOH LOW-K FILMS

CROSS-REFERENCE TO RELATED APPLICATIONS

This application claims the benefit of U.S. Provisional Application No. 61/305,491, filed Feb. 17, 2010, the entire contents of which are incorporated herein by reference.

TECHNICAL FIELD

Disclosed are precursors that are adapted to deposit SiCOH films with dielectric constant and Young's Modulus suitable for future generation dielectric films for use in the manufacture of semiconductor, photovoltaic, LCD-TFT, or flat panel type devices.

BACKGROUND

EP2264219 to JSR Corp. discloses an organosilane chemical vapor deposition compound having the formula:

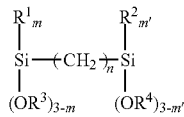

wherein $R^1$ and $R^2$ individually represent a hydrogen atom, an alkyl group having 1 to 4 carbon atoms, a vinyl group, or a phenyl group, $R^3$ and $R^4$ individually represent an alkyl group having 1 to 4 carbon atoms, an acetyl group, or a phenyl group, m is an integer from 0 to 2, and n is an integer from 1 to 3.

JSR Corp. disclose over 170 specific compounds that meet the formula, and those compounds probably do not exhaust the available iterations of the formula. JSR Corp. discloses at paragraphs 0033, 0045, and 0052, that the compound of the disclosed formula have 0 to 1 H atoms included in $R^1$ and $R^2$ from the viewpoint of ease of synthesis, purification, and handling or alternatively have 1 to 2 H atoms from the viewpoint of decreasing the boiling point of the compound and increasing the mechanical strength.

JSR Corp. further discloses the combination of the over 170 specific compounds with a porogen and an additional silane compound having the formula $R^6_a Si(OR^7)_{4-a}$, $R^8_b (R^9O)_{3-b}Si-O_e-Si(OR^{10})_{3-c}R^{11}_c$, and $-[R^{13}(R^{14}O)_{2-f} Si-(R^{15})_g]-$, with $R^6$, $R^8$ to $R^{11}$, $R^{13}$ and $R^{14}$ individually representing a H atom, a F atom, or a monovalent organic group, $R^7$ individually representing a monovalent organic group, $R^{15}$ representing an O atom, a phenylene group, or a group shown by $-(CH_2)_n-$, a being an integer from 0 to 4, b and c individually being integers from 0 to 3, e being 0 or 1, f being an integer from 0 to 2, g being 0 or 1, h being an integer from 2 to 3, and n being an integer from 1 to 6 (para 0062). The pore forming agent may be any compounds having a ring structure (para 0094). The numerically challenging combinations are alleged to produce an insulating film that exhibits "more excellent" mechanical strength and a low relative dielectric constant (para 0067).

Depositions using combinations of precursors may provide films having dielectric constants and Young's Modulus that are an approximate average of the dielectric constant and Young's Modulus of the films produced by the precursors alone. This phenomenon is partially demonstrated in Comparative Example 1 of the present application, which summarizes Examples 2 and 14-18 of EP2264219. This phenomenon is further demonstrated in Comparative Examples 2, 4, and 5.

Additionally, any improvements in Young's Modulus results for a specific precursor or combination of precursors frequently occur with an increase in dielectric constant. This phenomenon is demonstrated in Comparative Example 1 of the present application, which summarizes Examples 14 to 17 of EP2264219. This phenomenon is further demonstrated in Comparative Example 6.

The need remains for insulating films having low dielectric constant and high mechanical strength.

SUMMARY

Disclosed are methods of forming a SiCOH film layer on one or more substrates disposed within a reaction chamber. A Si—$(CH_2)_n$—Si containing precursor, with n=1 or 2, is introduced into the reaction chamber. The Si—$(CH_2)_n$—Si containing precursor is selected from the group consisting of:

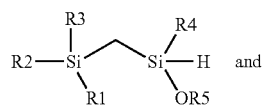

(Formula I, with n = 1)

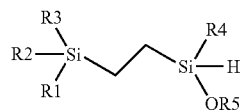

(Formula 2, with n = 2)

wherein each of R1 through R4 is independently selected from the group consisting of H, methyl, ethyl, propyl, vinyl, and C1-C3 alkoxy; R5 is selected from the group consisting of methyl, ethyl, and propyl; preferably at least one R1 through R4 is methyl, ethyl, or propyl; and at least one of R1 through R3 is an alkoxy that may be the same or different from —OR5. A vinyl-containing precursor is introduced into the reaction chamber. The vinyl-containing precursor has the formula $Si(R1)_x(O(R2))_{4-x}$, wherein at least one R1 is vinyl, an optional second R1 being a hydrogen or an alkyl group, preferably methyl or ethyl; each R2 is independently selected from an alkyl group, preferably methyl or ethyl; and x is 1 or 2. A porogen is introduced into the reaction chamber. The Si—$(CH_2)_n$—Si precursor, the vinyl-containing precursor, the porogen, and the substrate are contacted to form a SiCOH film on at least one surface of the substrate using a deposition process, preferably chemical vapor deposition. The method may further include one or more of the following aspects:
- the vinyl-containing precursor being selected from the group consisting of vinyldiethoxysilane, vinyldimethoxysilane, vinyltrimethoxysilane, vinyltriethoxysilane, vinylmethyldimethoxysilane, and vinylmethyldiethoxysilane;
- the vinyl-containing precursor being selected from the group consisting of vinyltriethoxysilane or vinylmethyldiethoxysilane;
- the porogen being substituted or unsubstituted bicyclo[2.2.1]hepta-2,5-diene;
- the deposition process being single frequency PECVD;
- rendering the SiCOH film porous;
- R1 through R4 not being H;
- the Si—$(CH_2)_n$—Si containing precursor being selected from the group consisting of $(EtO)_3Si-CH_2-Si(OEt)_2H$, $Me(OEt)_2Si-CH_2-Si(OEt)_2H$, $Me(OEt)_2Si-$ CH$_2$—Si(OEt)HMe, Me$_2$(OEt)Si—CH$_2$—Si(OEt)$_2$H, (EtO)Me$_2$SiCH$_2$Si(OMe)$_2$H, Me$_2$(OEt)Si—CH$_2$—Si (OEt)HMe, (OEt)$_3$Si—CH$_2$—Si(OEt)HMe, (EtO)$_3$Si—CH$_2$—Si(OMe)HMe, Me(OMe)$_2$Si—CH$_2$—Si (OMe)$_2$H, Me(OMe)$_2$Si—CH$_2$—Si(OMe)HMe, Me$_2$(OMe)SiCH$_2$Si(OMe)$_2$H, and Me$_2$(OEt)Si—CH$_2$—Si (OMe)HMe;

the Si—(CH$_2$)$_n$—Si containing precursor being selected from the group consisting of Me(OEt)$_2$Si—CH$_2$—Si (OEt)$_2$H, Me$_2$(OEt)Si—CH$_2$—Si(OEt)$_2$H, and Me(OEt)$_2$Si—CH$_2$—Si(OEt)HMe;

the Si—(CH$_2$)$_n$—Si containing precursor being selected from the group consisting of (EtO)$_3$Si—CH$_2$CH$_2$—Si (OEt)$_2$H, Me(OEt)$_2$Si—CH$_2$CH$_2$—Si(OEt)$_2$H, Me(OEt)$_2$Si—CH$_2$CH$_2$—Si(OEt)HMe, Me$_2$(OEt)Si—CH$_2$CH$_2$—Si(OEt)$_2$H, (EtO)Me$_2$Si CH$_2$CH$_2$Si(OMe)$_2$H, Me$_2$(OEt)Si—CH$_2$CH$_2$—Si(OEt)HMe, (OEt)$_3$Si—CH$_2$CH$_2$—Si(OEt)HMe, (EtO)$_3$Si—CH$_2$CH$_2$—Si (OMe)HMe, Me(OMe)$_2$Si—CH$_2$CH$_2$—Si(OMe)$_2$H, Me(OMe)$_2$Si—CH$_2$CH$_2$—Si(OMe)HMe, Me$_2$(OMe) Si CH$_2$CH$_2$Si(OMe)$_2$H, and Me$_2$(OEt)Si—CH$_2$CH$_2$—Si(OMe)HMe;

the Si—(CH$_2$)$_n$—Si containing precursor being selected from the group consisting of Me(OEt)$_2$Si—CH$_2$CH$_2$—Si(OEt)$_2$H, Me$_2$(OEt)Si—CH$_2$CH$_2$—Si(OEt)$_2$H, and Me(OEt)$_2$Si—CH$_2$CH$_2$—Si(OEt)HMe;

only one of R1 through R3 being H;

the Si—(CH$_2$)$_n$—Si containing precursor being selected from the group consisting of MeH(OMe)Si—CH$_2$—Si (OMe)HMe, (EtO)$_2$HSi—CH$_2$—Si(OEt)$_2$H, (EtO) HMeSi—CH$_2$—Si(OEt)HMe, and (iPrO)HMeSi—CH$_2$—Si(OiPr)HMe; and the SiCOH film having a dielectric constant that is lower than both (1) a dielectric constant of a SiCOH film formed by the Si—(CH$_2$)$_n$—Si containing precursor and the porogen and (2) a dielectric constant of a SiCOH film formed by the vinyl-containing precursor and the porogen.

Also disclosed are films formed by the disclosed methods. Preferably the films formed by the disclosed methods have a dielectric constant ranging from approximately 2.0 to approximately 2.7, preferably from approximately 2.0 to approximately 2.5, and a Young's Modulus ranging from approximately 4 GPa to approximately 10 GPa, preferably from approximately 5 GPa to approximately 10 GPa.

Notation and Nomenclature

Certain abbreviations, symbols, and terms are used throughout the following description and claims and include: the abbreviation "SiCOH" refers to a dielectric film containing Si, C, O, and H atoms; the abbreviation "pSiCOH" refers to the SiCOH film after it has been rendered porous; the abbreviation "BCHD" refers to bicyclo[2.2.1]hepta-2,5-diene, also called 2,5-norbornadiene; the abbreviation "VTEOS" refers to vinyltriethoxysilane ((HC=CH$_2$)(EtO)$_3$Si); the abbreviation "A" refers to Angstroms and 1 Angstrom=100 picometers; the abbreviation "PECVD" refers to plasma enhanced chemical vapor deposition; the abbreviation "CVD" refers to chemical vapor deposition; the abbreviation "MIM" refers to Metal Insulator Metal (a structure used in capacitors); the abbreviation "DRAM" refers to dynamic random access memory; the abbreviation "FeRAM" refers to ferroelectric random access memory; the abbreviation "CMOS" refers to complementary metal-oxide-semiconductor; the abbreviation "UV" refers to ultraviolet; and the abbreviation "RF" refers to radiofrequency.

Furthermore, the present disclosure envisions use of one or more of each of the three precursors (the Si—(CH$_2$)$_n$—Si precursor, the vinyl-containing precursor, and the porogen) and interchangeably refers to each in the singular or plural without intending to limit the scope thereby.

The term "alkyl group" refers to saturated functional groups containing exclusively carbon and hydrogen atoms. Further, the term "alkyl group" refers to linear, branched, or cyclic alkyl groups. Examples of linear alkyl groups include, without limitation, methyl groups, ethyl groups, propyl groups, butyl groups, etc. Examples of branched alkyl groups include, without limitation, t-butyl. Examples of cyclic alkyl groups include without limitation, cyclopropyl groups, cyclobutyl groups, cyclopentyl groups, cyclohexyl groups, etc.

As used herein, the abbreviation "Me" refers to a methyl group; the abbreviation "Et" refers to an ethyl group; the abbreviation "Pr" refers to a propyl group; the abbreviation "nPr" refers to a chain propyl group; the abbreviation "iPr" refers to an isopropyl group; the abbreviation "Bu" refers to a butyl(n-butyl) group; the abbreviation "tBu" refers to a tert-butyl group; the abbreviation "sBu" refers to a sec-butyl group; the abbreviation "iBu" refers to an iso-butyl group; and the abbreviation "TMS" refers to a trimethylsilyl group.

The standard abbreviations of the elements from the periodic table of elements are used herein. It should be understood that elements may be referred to by these abbreviations (e.g., Si refers to silicon, C refers to carbon, etc.).

DESCRIPTION OF PREFERRED EMBODIMENTS

Applicants have surprisingly discovered that CVD depositions using a combination of specific Si—(CH$_2$)$_n$—Si containing precursors, wherein n is 1 or 2, specific vinyl alkoxysilane or vinyl alkylalkoxysilane precursors, and specific porogens results in SiCOH films having the same or improved dielectric constant and improved Young's Modulus when compared to the dielectric constant and Young's Modulus of SiCOH films deposited from either precursor/porogen combination alone. Applicants believe that the Si—H bond in the Si—(CH$_2$)$_n$—Si containing precursor reacts with the vinyl group on the vinyl alkoxysilane or vinyl alkylalkoxysilane to produce films having lower dielectric constant and improved mechanical strength.

A SiCOH film is deposited by vapor deposition, preferably CVD, and more preferably PECVD, using one or more Si—(CH$_2$)$_n$—Si containing precursors described in more detail below, one or more second silicon-containing precursors, and one or more porogens. The film is preferably cured using ultra-violet light or another energy source to remove the porogen in order to produce a pSiCOH film having lower dielectric constants.

Applicants believe that the disclosed Si—(CH$_2$)$_n$—Si containing precursors are adapted to deposit films that contain the Si—(CH$_2$)$_n$—Si structure. In general, the Si—(CH$_2$)$_n$—Si containing precursors may be described by the formulae below:

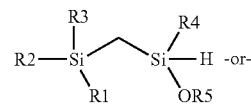

(Formula 1)

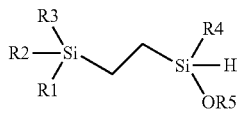

(Formula 2)

wherein each of R1 through R4 is independently selected from the group consisting of H, methyl, ethyl, propyl, vinyl, and C1-C3 alkoxy; R5 is selected from the group consisting of methyl, ethyl, and propyl; preferably at least one R1 through R4 is methyl, ethyl, or propyl; and at least one of R1 through R3 is an alkoxy that may be the same or different from —OR5. Preferably, R1 and R2 are Me, R3 and R4 are OEt, and R5 is Et.

Alkoxy ligands, i.e. methoxy, ethoxy or propoxy, lead to a cross-linked Si—O—Si structure in the SiCOH film. Therefore, at least one alkoxy ligand should be present at each Si atom in order to enable sufficient cross-linking. Si—OEt groups are preferred because they are somewhat less reactive than Si—OMe groups and therefore less likely to lead to self-polymerization of the precursors during storage or adverse health effects in the event of environmental exposure to the precursor.

Si-Me groups introduce open volume or ultra-micropores into the structure and reduce the dielectric constant. They also increase the carbon content of the eventual film, which helps to increase resistance to plasma damage and wet etching. High carbon content is also believed to increase resistance to "flopover". "Flopover" is where closely spaced features of high aspect ratio collapse upon one another. Therefore at least one methyl group within the molecule is desirable. However, methyl groups also lead to reduced cross-linking and therefore are detrimental for mechanical properties. The number of methyl groups may be chosen depending on the balance between low dielectric constant and mechanical properties desired.

The Si—(CH$_2$)$_n$—Si substructure allows incorporation of carbon, to provide good resistance to plasma damage and flopover, while maintaining cross-linking to preserve mechanical properties.

Si—H in the precursor has been shown to favor incorporation of some porogens. However, residual Si—H in the film tends to react with atmospheric oxygen and/or moisture to form Si—OH which in turn leads to moisture uptake into the film and an increase in k. Therefore it is important to have the appropriate number of Si—H bonds. The inventors believe that one Si—H bond per precursor molecule may be optimum.

In a first embodiment, R1 through R4 is not H, providing a precursor with only one Si—H bond. As demonstrated in Example 1 and Comparative Examples 4 and 6, the combination of a Si—(CH$_2$)$_n$—Si containing precursor having only one Si—H bond with the vinyl-containing precursor and BCHD (Example 1) produces films having improved dielectric constant results with minimum change to the Young's Modulus results when compared to the films produced by each individual precursor/BCHD combination (Comparative Examples 4 and 6). In contrast, as demonstrated in Comparative Examples 2, 3, and 5, the Si—(CH$_2$)$_n$—Si precursors having no Si—H bonds did not produce films having improved dielectric constant or Young's Modulus due to the addition of the vinyl-containing precursor. Applicants believe that the vinyl group from the vinyl-containing precursor reacts with the Si—H group of the Si—(CH$_2$)$_n$—Si containing precursor, resulting in carbon incorporation in the film.

Exemplary molecules of the first embodiment include (EtO)$_3$Si—CH$_2$—Si(OEt)$_2$H, Me(OEt)$_2$Si—CH$_2$—Si(OEt)$_2$H, Me(OEt)$_2$Si—CH$_2$—Si(OEt)HMe, Me$_2$(OEt)Si—CH$_2$—Si(OEt)$_2$H, (EtO)Me$_2$SiCH$_2$Si(OMe)$_2$H, Me$_2$(OEt)Si—CH$_2$—Si(OEt)HMe, (OEt)$_3$Si—CH$_2$—Si(OEt)HMe, (EtO)$_3$Si—CH$_2$—Si(OMe)HMe, Me(OMe)$_2$Si—CH$_2$—Si(OMe)$_2$H, Me(OMe)$_2$Si—CH$_2$—Si(OMe)HMe, Me$_2$(OMe)SiCH$_2$Si(OMe)$_2$H, and/or Me$_2$(OEt)Si—CH$_2$—Si(OMe)HMe, preferably Me(OEt)$_2$Si—CH$_2$—Si(OEt)$_2$H, Me$_2$(OEt)Si—CH$_2$—Si(OEt)$_2$H, and/or Me(OEt)$_2$Si—CH$_2$—Si(OEt)HMe.

Alternatively, the Si—(CH$_2$)$_n$—Si containing precursors of the first embodiment include (EtO)$_3$Si—CH$_2$CH$_2$—Si(OEt)$_2$H, Me(OEt)$_2$Si—CH$_2$CH$_2$—Si(OEt)$_2$H, Me(OEt)$_2$Si—CH$_2$CH$_2$—Si(OEt)HMe, Me$_2$(OEt)Si—CH$_2$CH$_2$—Si(OEt)$_2$H, (EtO)Me$_2$Si CH$_2$CH$_2$Si(OMe)$_2$H, Me$_2$(OEt)Si—CH$_2$CH$_2$—Si(OEt)HMe, (OEt)$_3$Si—CH$_2$CH$_2$—Si(OEt)HMe, (EtO)$_3$Si—CH$_2$CH$_2$—Si(OMe)HMe, Me(OMe)$_2$Si—CH$_2$CH$_2$—Si(OMe)$_2$H, Me(OMe)$_2$Si—CH$_2$CH$_2$—Si(OMe)HMe, Me$_2$(OMe)Si CH$_2$CH$_2$Si(OMe)$_2$H, and/or Me$_2$(OEt)Si—CH$_2$CH$_2$—Si(OMe)HMe, preferably Me(OEt)$_2$Si—CH$_2$CH$_2$—Si(OEt)$_2$H, Me$_2$(OEt)Si—CH$_2$CH$_2$—Si(OEt)$_2$H, and/or Me(OEt)$_2$Si—CH$_2$CH$_2$—Si(OEt)HMe.

In a second embodiment, R1, R2, or R3 is H, providing a precursor with one H bonded to each Si. Theoretically, Applicants believe that the same vinyl/Si—H reaction mechanism described in the first embodiment will take place in the second embodiment. However, a very small number of preliminary test results with one specific molecule did not provide the expected synergy.

Exemplary molecules of the second embodiment include MeH(OMe)Si—CH$_2$—Si(OMe)HMe, (EtO)$_2$HSi—CH$_2$—Si(OEt)$_2$H, (EtO)HMeSi—CH$_2$—Si(OEt)HMe, and (iPrO)HMeSi—CH$_2$—Si(OiPr)HMe.

The synthesis of the Si—CH$_2$—Si precursors may be achieved using conventional methods according to the scheme:

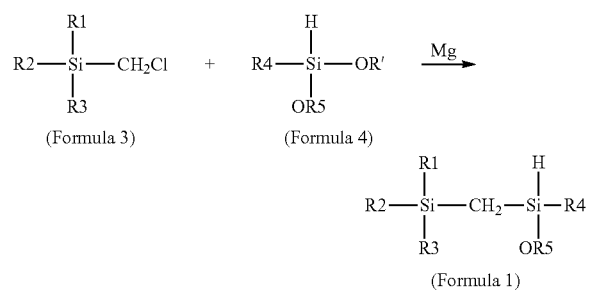

wherein R' is ethyl or methyl and a Grignard reagent R1R2R3SiCH$_2$MgCl is formed as an intermediate. The Grignard reagent may be formed by adding the starting chloro compound (Formula 3) dropwise to magnesium turnings in a dry, refluxing solvent such as tetrahydrofuran (THF). The methoxy or ethoxy compound (Formula 4) is then added dropwise to the Grignard reaction solution to form the desired product (Formula 1). The magnesium salt by-product of the reaction may be removed by filtration, followed by evaporation of the solvent to isolate the desired product (Formula 1) from solution. Further details of the procedure for formation of Si—CH$_2$—Si linkages via a Grignard reagent may be found in U.S. Pat. No. 5,296,624 (Larson et al.) and US Pat. App. Pub. No. 2009/0299086 (Nobe et al.). All reactions described herein should be carried out under an inert atmosphere, for example under flowing dry nitrogen.

According to the above procedure, starting materials for preferred compounds are as follows:

(EtO)MeHSICH$_2$SiHMe(OEt)  MeH(OEt)$_2$SiCH$_2$Cl+Si(OEt)$_2$MeH (EtO)$_3$Si—CH$_2$—Si(OEt)$_2$H (EtO)$_3$SiCH$_2$Cl+Si(OEt)$_3$H

Me(OEt)$_2$Si—CH$_2$—Si(OEt)$_2$H  Me(OEt)$_2$SiCH$_2$Cl+Si(OEt)$_3$H

Me(OEt)$_2$Si—CH$_2$—Si(OEt)HMe Me(OEt)$_2$SiCH$_2$Cl+Si(OEt)$_2$MeH

Me$_2$(OEt)Si—CH$_2$—Si(OEt)$_2$H Me$_2$(OEt) SiCH$_2$Cl+Si(OEt)$_3$H

Me$_2$(OEt)Si—CH$_2$—Si(OEt)HMe Me(OEt)$_2$SiCH$_2$Cl+Si(OEt)$_2$MeH (OEt)$_3$Si—CH$_2$—Si(OEt)HMe (OEt)$_3$SiCH$_2$Cl+Si(OEt)$_2$MeH

These starting materials are available commercially.

An alternative synthesis method, most applicable for symmetric molecules, is according to the schemes:

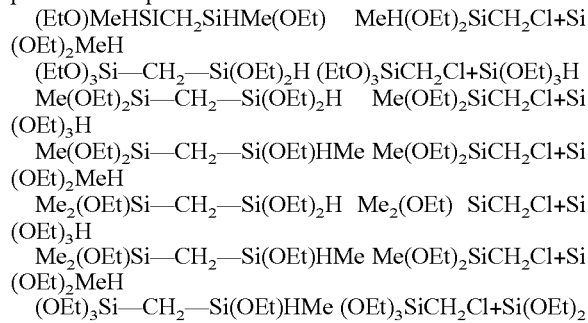

wherein RO is an alkoxy group. For example, with R1=R6=H, and R=Et, scheme A may be used to prepare (EtO)$_2$HSiCH$_2$SiH(OEt)$_2$. These starting materials are available commercially. Reactions should be carried out in a solvent such as THF, with reagents added slowly with stirring. In place of RONa, an alcohol, ROH, may be used together with a base, such as a trialkylamine or pyridine.

The compound (EtO)MeHSiCH$_2$SiHMe(OEt) may be prepared according to scheme B with R=Et, R1=R6=H, R2=R5=Me, and with the starting material prepared according to the procedure described by Hemida et al. J. Mat. Sci 32 3485 (1997).

The synthesis of the Si—CH$_2$CH$_2$—Si precursors may be achieved using the following exemplary method:

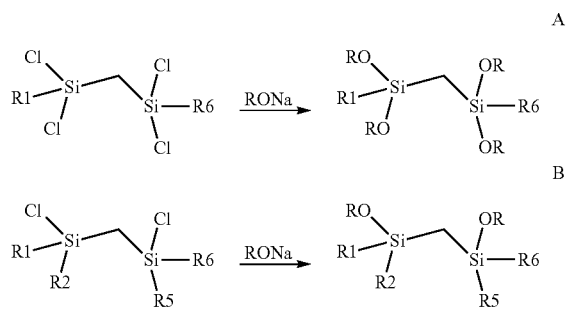

wherein R may be an alkyl or alkoxy group. The product may be formed by adding successively the starting materials (Formula 5 and 6) dropwise in a dry solvent such as toluene, at room temperature with stirring. Chloroplatinic acid is added to the mixture. The reaction mixture is refluxed. After cooling the mixture to room temperature, pyridine is introduced to the mixture. The desired alcohol is then added dropwise. After the addition, the mixture is allowed to react at room temperature. The salt by-product of the reaction may be removed by filtration, followed by a fractionated distillation to isolate the desired product (Formula 2). Further details of procedures for formation of Si—CH$_2$CH$_2$—Si linkages may be found in EP 2 264 219 and on page 484 of the Gelest catalog.

Si—(CH$_2$)$_n$—Si precursors as described above may be combined with one another and with one or more vinyl-containing precursors suitable for deposition of low-k SiCOH films. Many vinyl-containing precursors are known in the literature. An important class of such precursors is described by the formula Si(R1)$_x$(O(R2))$_{4-x}$, wherein the first R1 is vinyl and the optional second R1 is a hydrogen or an alkyl group, preferably methyl or ethyl; each R2 is independently an alkyl group; and x is 1 or 2. Preferably, the vinyl-containing precursor is vinyldiethoxysilane, vinyldimethoxysilane, vinyltrimethoxysilane, vinyltriethoxysilane, vinylmethyldimethoxysilane, and vinylmethyldiethoxysilane, and more preferably vinyltriethoxysilane or vinylmethyldiethoxysilane.

Suitable porogens include unsaturated polycyclic hydrocarbons such as 2,5-norbornadiene (bicyclo[2.2.1]hepta-2,5-diene or BCHD) and substituted BCHD.

The Si—(CH$_2$)$_n$—Si precursors, the vinyl-containing precursors, and the porogen may be used to form a porous SiCOH film on a substrate, which may or may not already include other layers thereon, by vapor deposition processes known in the art. Exemplary, but non-limiting reference to the vapor deposition processes disclosed in U.S. Pat. Nos. 6,312,793, 6,479,110, 6,756,323, 6,953,984, 7,030,468, 7,049,427, 7,282,458, 7,288,292, 7,312,524, 7,479,306, and U.S. Pat. App. Pub. No. 2007/0057235 is incorporated herein by reference.

For example, it is anticipated that the Si—(CH$_2$)$_n$—Si precursors, the vinyl-containing precursors, and the porogens disclosed herein may be used in the methods disclosed of depositing a SiCOH dielectric material in U.S. Pat. No. 7,479,306, and more particularly as disclosed in Example 6. As described in Example 6, a substrate is placed on a heated susceptor (also known as a wafer chuck) in a PECVD deposition reaction chamber. The susceptor is heated at 300° C. to 425° C., and preferably at 350° C. to 400° C., although the temperature may also be between 150° C. and 300° C. The precursors flow rates may vary between 100 to 2000 mg/min. He gas may flow at a rate between 10 to 500 sccm. The porogen flow rate may vary between 50 to 2000 mg/min. The precursor flows are stabilized to reach a pressure in the range from 1-10 Torr (133-1333 Pa). RF radiation is applied to the shower head for a time between 5 to 500 seconds. One of ordinary skill in the art will recognize that differing deposition devices may require different parameters.

When utilizing BCHD as the porogen, care should be taken to incorporate therein a polymerization inhibitor such as those disclosed by co-pending U.S. patent application Ser. No. 12/613,260, incorporated herein in its entirety by reference. Common highlights of these processes are further described herein.

The substrate is placed in the reaction chamber of a vapor deposition tool. The Si—(CH$_2$)$_n$—Si precursors and the vinyl-containing precursors used to form the insulating film and the porogen may be delivered directly in a gaseous state to the reaction chamber, delivered as a liquid vaporized and introduced into the reaction chamber, or transported by an inert carrier gas including, but not limited to, helium or argon. Preferably, the Si—(CH$_2$)$_n$—Si precursors, the vinyl-containing precursors, and the porogens are vaporized at a temperature between about 70° C. and about 150° C. in the presence of a carrier gas, such as He or Ar, prior to introduction into the reaction chamber.

The type of substrate upon which the SiCOH layer will be deposited will vary depending on the final use intended. The substrate may include doped or undoped silicon-containing material, such as SiCN, optionally coated with a silicon oxide layer and metals that are used as conducting materials in such applications, such as for example, tungsten, titanium, tantalum, ruthenium, or copper. Alternatively, the substrate may include copper interconnects and insulating regions, such as another low-k material, optionally coated with a sealing layer such as $SiO_2$ or SiN. Other examples of substrates upon which the pSiCOH film may be coated include, but are not limited to, solid substrates such as metal substrates (for example, Ru, Al, Ni, Ti, Co, Pt and metal silicides, such as $TiSi_2$, $CoSi_2$, and $NiSi_2$); metal nitride containing substrates (for example, TaN, TiN, WN, TaCN, TiCN, TaSiN, and TiSiN); semiconductor materials (for example, Si, SiGe, GaAs, InP, diamond, GaN, and SiC); insulators (for example, $SiO_2$, $Si_3N_4$, $HfO_2$, $Ta_2O_5$, $ZrO_2$, $TiO_2$, $Al_2O_3$, and barium strontium titanate); or other substrates that include any number of combinations of these materials. The actual substrate utilized will also depend upon the SiCOH layer utilized.

The Si—$(CH_2)_n$—Si containing precursors, the vinyl-containing precursors, and the porogen are introduced into the film deposition chamber simultaneously or in pulsed sequence and contacted with the substrate to form an insulating layer on at least one surface of the substrate. Currently, the precursors and porogen are introduced into the PECVD chamber simultaneously. The film deposition chamber may be any enclosure or chamber of a device in which deposition methods take place, such as, without limitation, a parallel plate-type reactor, a cold-wall type reactor, a hot-wall type reactor, a single-wafer reactor, a multi-wafer reactor, or other such types of deposition systems.

One of ordinary skill in the art would be able to easily select appropriate values for the process variables controlled during deposition of the low-k films, including RF power, precursor mixture and flow rate, pressure in the reaction chamber, and substrate temperature.

The SiCOH layer may subsequently be rendered porous by additional processing to reduce the dielectric constant of the insulating layer. Such processing includes, but is not limited to, annealing, UV light, or electron beam.

The resulting film preferably has a dielectric constant that is lower than both (1) the dielectric constant of a SiCOH film formed by the Si—$(CH_2)_n$—Si containing precursor and the porogen and (2) the dielectric constant of a SiCOH film formed by the vinyl-containing precursor and the porogen. The resulting film preferably has a dielectric constant ranging from approximately 2.0 to approximately 2.7 and a Young's Modulus ranging from approximately 4 to approximately 10.

EXAMPLES

The following non-limiting examples are provided to further illustrate embodiments of the invention. However, the examples are not intended to be all inclusive and are not intended to limit the scope of the inventions described herein.

In all of the following examples except Comparative Example 1, SiCOH films were deposited using an Applied Materials P5000 plasma enhanced chemical vapor deposition apparatus equipped with a DxZ deposition chamber and TEOS kit. The flow rates of the precursors were controlled by mass flow controllers which were either TEOS or DMDMOS calibrated. The flow rate of the porogen was controlled by a mass flow controller calibrated for BCHD.

After deposition, the films were cured in a separate custom chamber (also based on a DxZ chamber)—modified to include a fused silica window in the chamber lid and a UV lamp irradiating the wafer through the window. Films were cured for from 3 to 30 minutes under 1 torr pressure, nitrogen flow at 1 slm, and a susceptor temperature of 400° C.

In order to evaluate the dielectric constant of the deposited films in the following examples except for Comparative Example 1, the dielectric constant was determined with a mercury probe.

In order to evaluate the mechanical performance of the deposited films in the following examples except for Comparative Example 1, their Young's Modulus was determined by nanoindentation. In order to achieve representative measurements, each film thickness was about or greater than 10 times the characteristic dimensions of the nanoindentation tip. This thickness is selected in order to eliminate the effects of the substrate. The Young's Modulus determined at this depth for each sample was generally its minimum value.

Comparative Example 1

Table 1 summarizes the results achieved by JSR Corp. in the Examples of EP2264219.

The results from Examples 2 and 14-18 of EP2264219 appear to demonstrate that the proposed combinations of the Si—$(CH_2)_n$—Si containing precursor with the second precursor and a porogen do not produce any significant changes to the dielectric constant and Young's Modulus results. Unfortunately, as the results for $(CH_3CH_2O)_2CH_3SiH$+pore former were not provided, the averaging effect that occurs from mixing the two precursors (i.e., the Si—$(CH_2)_n$—Si precursor and the diethoxymethylsilane precursor) is not explicitly demonstrated. However, as most of the dielectric constant results and all of the Young's Modulus results for films formed from the Si—$(CH_2)_n$—Si containing precursor with BCHD are better than the results for films formed from the Si—$(CH_2)_n$—Si containing precursor, the diethoxymethylsilane precursor and BCHD, one of ordinary skill in the art would conclude that the Young's Modulus for films formed by the combination of the diethoxymethylsilane precursor with BCHD would be lower than those for films formed by Si—$(CH_2)_n$—Si containing precursors and BCHD.

The results from Examples 16, 14, 17, and 15 of EP2264219, in that order, demonstrate that any improvements in Young's Modulus results for a specific precursor or combination of precursors frequently occur with an increase in dielectric constant.

Examples 1, 3-6, and Comparative Examples 1 and 2 of EP2264219 summarize the results of films formed using BCHD as the porogen. Examples 10, 12, 13, and Comparative Examples 5 and 6 of EP2264219 summarize the results of films formed using p-xylene as the porogen. Examples 7-9 and 11 and Comparative Examples 3 and 4 of EP2264219 summarize the results of films formed using cyclopentene oxide as the porogen. Except for Example 11 of EP2264219, the films formed using BCHD or p-xylene as the porogen have lower dielectric constants when compared to the films formed using cyclopentene oxide. Within the results for a specific porogen, the Young's Modulus results vary widely (i.e., the Young's Modulus ranges from 9.3 to 16.5 for BCHD, from 11.2 to 14.4 for cyclopentene oxide, and from 9.1 to 14.2 for p-xylene). Finally, the results from Examples 3, 4, and 13 of EP2264219 appear to indicate that the addition of oxygen to the deposition process results in films having a higher Young's Modulus.

Please note that the exemplary deposition methods in EP2264219 utilized a dual-frequency plasma CVD apparatus, whereas Applicants have utilized single-frequency plasma in the following examples. As a result, the results obtained from the examples provided by JSR Corp. in Table 1 below are not comparable to Applicants' following examples.

TABLE 1

| Ex # | Precursors (Ratio, where relevant) | k-value | Young's Modulus (GPa) |
|---|---|---|---|
| 2 | $(CH_3O)_2CH_3Si—CH_2—Si—CH_3(OCH_3)_2$ + BCHD (1:2) | 2.36 | 14.8 |
| 18 | $(CH_3O)_2CH_3Si—CH_2—Si—CH_3(OCH_3)_2$ + BCHD (1:1) | 2.39 | 11.3 |
| 14 | $(CH_3O)_2CH_3Si—CH_2—Si—CH_3(OCH_3)_2$ + $(CH_3CH_2O)_2CH_3SiH$ + BCHD | 2.38 | 13.1 |
| 15 | $(CH_3O)_2CH_3Si—CH_2—Si—CH_3(OCH_3)_2$ + $(CH_3CH_2O)_2CH_3SiH$ + BCHD | 2.34 | 12.7 |
| 16 | $(CH_3O)_2CH_3Si—CH_2—Si—CH_3(OCH_3)_2$ + $(CH_3CH_2O)_2CH_3SiH$ + pore former | 2.39 | 13.4 |
| 17 | $(CH_3O)_2CH_3Si—CH_2—Si—CH_3(OCH_3)_2$ + $(CH_3CH_2O)_2CH_3SiH$ + pore former | 2.36 | 12.9 |
| 1 | $(CH_3O)_3Si—CH_2—Si—(OCH_3)_3$ + BCHD | 2.39 | 15.3 |
| 5 | $(CH_3O)_3Si—CH_2—Si—CH_3(OCH_3)_2$ + BCHD | 2.41 | 13.5 |
| 6 | $(CH_3O)_3CH_3Si—CH_2—Si—(CH_3)_2(OCH_3)$ + BCHD | 2.36 | 11.3 |
| Comp 1 | $CH_3Si(OCH_3)_3$ + BCHD | 2.40 | 10.9 |
| Comp 2 | $((CH_3)_3SiCH_2)CH_3Si(OCH_3)_2$ + BCHD | 2.37 | 9.3 |
| 3 | $(CH_3O)_2HSi—CH_2—Si—CH_3(OCH_3)_2$ + BCHD + $O_2$ | 2.35 | 16.5 |
| 4 | $(CH_3O)_2HSi—CH_2—Si—H(OCH_3)_2$ + BCHD + $O_2$ | 2.39 | 16.5 |
| 7 | $(CH_3O)_2(CH_2=CH)SiCH_2Si(HC=CH_2)(OCH_3)_2$ + cyclopentene oxide | 2.50 | 14.4 |
| 8 | $(CH_3O)_3Si—CH_2—Si(HC=CH_2)(OCH_3)_2$ + cyclopentene oxide | 2.55 | 14.2 |
| 9 | $(CH_3O)_3Si—CH_2—Si(HC=CH_2)_2(OCH_3)$ + cyclopentene oxide | 2.52 | 13.4 |
| 11 | $(CH_3CH_2O)_3Si—CH_2CH_2—SiCH_2CH_3(OCH_2CH_3)_2$ + cyclopentene oxide | 2.34 | 13.8 |
| Comp 3 | $(HC=CH_2)Si(OCH_3)_3$ + cyclopentene oxide | 2.55 | 12.9 |
| Comp 4 | $((HC=CH_2)_2CH_3Si)CH_2Si(OCH_3)_3$ + cyclopentene oxide | 2.51 | 11.2 |
| 10 | $(CH_3CH_2O)_2CH_3CH_2Si—CH_2CH_2—SiCH_2CH_3(OCH_2CH_3)_2$ + p-xylene | 2.40 | 13.8 |
| 12 | $(CH_3CH_2O)_2CH_3CH_2Si—CH_2CH_2—Si(CH_2CH_3)_2(OCH_2CH_3)$ + p-xylene | 2.37 | 11.8 |
| Comp 5 | $(CH_3CH_2O)_2CH_3CH_2Si—CH=CH—SiCH_2CH_3(OCH_2CH_3)_2$ + p-xylene | 2.41 | 14.2 |
| Comp 6 | $((CH_3CH_2)_3SiCH_2CH_2)CH_3CH_2Si(OCH_2CH_3)_2$ + p-xylene | 2.35 | 9.1 |
| 13 | $(CH_3CH_2O)_3Si—CH_2CH_2—SiH(CH_2CH_3)(OCH_2CH_3)$ + p-xylene + $O_2$ | 2.41 | 13.6 |

Comparative Example 2

$Me(EtO)_2Si—CH_2—SiMe(OEt)_2$

Multiple tests were performed using $Me(EtO)_2Si—CH_2—SiMe(OEt)_2$ and BCHD to deposit SiCOH films. The $Me(EtO)_2Si—CH_2—SiMe(OEt)_2$ flow rate varied from 300 mg/min to 800 mg/min. The BCHD flow rate varied from 300 mg/min to 750 mg/min. The helium carrier gas flow rates were kept at 350 sccm. The oxygen flow rates were between 5 sccm and 30 sccm. The susceptor temperature was set at either 260° C. or 300° C. The plasma power was between 200 W and 600 W. The spacing was set between 0.275 inches (6.985 mm) or 0.500 inches (12.7 mm). "Spacing" refers to the separation between the susceptor, on which the wafer rests, and the "showerhead", which is the upper electrode through which gases are introduced. The best dielectric constant obtained was approximately 2.5. The resulting film had a Young's Modulus of approximately 4.4 GPa at a k-value of approximately 2.51.

Comparative Example 3

$Me(EtO)_2Si—CH_2CH_2—SiMe(OEt)_2$

Multiple tests were performed using $Me(EtO)_2Si—CH_2CH_2—SiMe(OEt)_2$ and BCHD to deposit SiCOH films. The $Me(EtO)_2Si—CH_2CH_2—SiMe(OEt)_2$ flow rate varied from 300 mg/min to 600 mg/min. The BCHD flow rate varied from 300 mg/min to 800 mg/min. The helium carrier gas flow rates were kept at 350 sccm or 1000 sccm. The oxygen flow rates were between 5 sccm and 30 sccm. The susceptor temperature was set at either 260° C. or 300° C. The plasma power was between 200 W and 500 W. The spacing was set between 0.275 inches (6.985 mm) or 0.500 inches (12.7 mm). The best dielectric constant obtained was approximately 2.4. The resulting film had a Young's Modulus of approximately 3.5 GPa.

Comparative Example 4

$(HC=CH_2)(EtO)_3Si$

Multiple tests were performed using $(HC=CH_2)(EtO)_3Si$ and BCHD to deposit SiCOH films. The $(HC=CH_2)(EtO)_3Si$ flow rate was 750 mg/min. The BCHD flow rate was 800 mg/min. A helium carrier gas flow rate was kept at 750 sccm. The oxygen flow rate was set at 0 sccm. The susceptor temperature was set at 260° C. The plasma power was set at 150 W. The spacing was set at 0.500 inches (12.7 mm). The best dielectric constant obtained was approximately 2.31. The resulting film had a Young's Modulus of 5.5 GPa.

Comparative Example 5

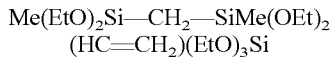
Me(EtO)$_2$Si—CH$_2$—SiMe(OEt)$_2$
(HC=CH$_2$)(EtO)$_3$Si

A test was performed with Me(EtO)$_2$Si—SiMe(OEt)$_2$, (HC=CH$_2$)(EtO)$_3$Si, and BCHD to deposit SiCOH films. The Me(EtO)$_2$Si—CH$_2$—SiMe(OEt)$_2$ flow rate was 200 mg/min. The (HC=CH$_2$)(EtO)$_3$Si flow rate was 500 mg/min. The BCHD flow rate was 800 mg/min. The helium carrier gas flow rates were kept at 500 sccm. The oxygen flow rate was 5 sccm. The susceptor temperature was set at 300° C. The plasma power was 500 W. The spacing was set at 0.500 inches (12.7 mm). The dielectric constant obtained was approximately 2.41. The resulting film had a Young's Modulus of approximately 3.6 GPa The dielectric constant obtained from the films formed from a combination of Me(EtO)$_2$Si—CH$_2$—SiMe(OEt)$_2$, (HC=CH$_2$)(EtO)$_3$Si, and BCHD (i.e., 2.41) is almost the exact average of the dielectric constant of the films formed by Me(EtO)$_2$Si—CH$_2$—SiMe(OEt)$_2$ and BCHD (i.e., 2.5) and (HC=CH$_2$)(EtO)$_3$Si and BCHD (i.e., 2.31). Furthermore, the Young's Modulus results were lower for films formed from the Me(EtO)$_2$Si—CH$_2$—SiMe(OEt)$_2$, (HC=CH$_2$)(EtO)$_3$Si, and BCHD combination when compared to films formed from the individual precursor/BCHD combination.

Comparative Example 6

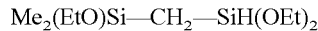
Me$_2$(EtO)Si—CH$_2$—SiH(OEt)$_2$

Multiple tests were performed using Me$_2$(EtO)Si—CH$_2$—SiH(OEt)$_2$ and BCHD to deposit SiCOH films. The Me$_2$(EtO)Si—CH$_2$—SiH(OEt)$_2$ flow rate varied from 300 mg/min to 750 mg/min. The BCHD flow rate varied from 300 mg/min to 750 mg/min. The helium carrier gas flow rates were kept at 500 sccm. The oxygen flow rate was set at 0, 5, 15, 30, or 50 sccm. The susceptor temperature was set at either 260° C. or 300° C. The plasma power was set at 250 W, 300 W, 400 W, or 500 W. The spacing was set at either 0.275 inches (6.985 mm) or 0.500 inches (12.7 mm). The best dielectric constant obtained was approximately 2.3. The resulting film had a Young's Modulus of 4.2 GPa with 5 sccm O$_2$ at a k value of 2.31, and a Young's Modulus of 6.5 GPa with 30 sccm O$_2$ at a k value of 2.39. Once again, the improvement in Young's Modulus for a specific precursor combination was accompanied by an increase in dielectric constant.

Example 1

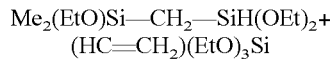
Me$_2$(EtO)Si—CH$_2$—SiH(OEt)$_2$+
(HC=CH$_2$)(EtO)$_3$Si

Multiple tests were performed using Me$_2$(EtO)Si—CH$_2$—SiH(OEt)$_2$, (HC=CH$_2$)(EtO)$_3$Si, and BCHD to deposit SiCOH films. The Me$_2$(EtO)Si—CH$_2$—SiH(OEt)$_2$ flow rate varied from 250 mg/min to 500 mg/min. The (HC=CH$_2$)(EtO)$_3$Si flow rate varied from 250 mg/min to 500 mg/min. The BCHD flow rate was 800 mg/min. The helium carrier gas flow rates were kept at 500 sccm. The oxygen flow rate varied between 5 sccm and 30 sccm. The susceptor temperature was set at either 260° C. or 300° C. The plasma power was set at either 300 W or 500 W. The reaction chamber pressure was set at 8 Torr. The spacing was set at 0.500 inches (12.7 mm). The best dielectric constant obtained was approximately 2.17, which is unexpectedly better than dielectric constants obtained in Comparative Example 4 and 6. Additionally, the resulting film had a Young's Modulus of 6.0 GPa at a k value of 2.28 and 6.1 GPa at a k value of 2.23.

As shown in Table 2, the dielectric constants (k measured) for all but one of the films formed by the mixture of Me$_2$(EtO)Si—CH$_2$—SiH(OEt)$_2$, (HC=CH$_2$)(EtO)$_3$Si, and BCHD were lower than the best dielectric constant for films obtained from Me$_2$(EtO)Si—CH$_2$—SiH(OEt)$_2$ and BCHD or (HC=CH$_2$)(EtO)$_3$Si and BCHD. Additionally, although the dielectric constants were lower, the Young's Modulus results for the films formed from the combination were approximately the same as the Young's Modulus results for films formed from the Me$_2$(EtO)Si—CH$_2$—SiH(OEt)$_2$/BCHD combination.

TABLE 2

| | Tests | | | | | | | | |
|---|---|---|---|---|---|---|---|---|---|
| | BCHD (mg/min) | He (sccm) | Me$_2$(OEt)Si—CH$_2$—Si(OEt)$_2$H (mg/min) | VTEOS (mg/min) | O2 (sccm) | Power (W) | Temp (C.) | Thickness (A) | k measured |
| Best Me$_2$(OEt)Si—CH$_2$—Si(OEt)$_2$H | 750 | 500 | 750 | 0 | 30 | 500 | 300 | 4958 | 2.31 |
| Best VTEOS | 500 | 750 | 0 | 750 | 0 | 150 | 260 | 1460 | 2.32 |
| Mixture 1 | 800 | 500 | 500 | 250 | 30 | 500 | 300 | 4548 | 2.17 |
| Mixture 2 | 800 | 500 | 250 | 500 | 30 | 300 | 300 | 4769 | 2.26 |
| Mixture 3 | 800 | 500 | 500 | 250 | 5 | 300 | 300 | 4555 | 2.25 |
| Mixture 4 | 800 | 500 | 250 | 500 | 5 | 500 | 300 | 4391 | 2.28 |
| Mixture 5 | 800 | 500 | 500 | 250 | 30 | 500 | 260 | 3926 | 2.25 |
| Mixture 6 | 800 | 500 | 250 | 500 | 30 | 300 | 260 | 4161 | 2.36 |
| Mixture 7 | 800 | 500 | 500 | 250 | 5 | 300 | 260 | 3805 | 2.21 |
| Mixture 8 | 800 | 500 | 250 | 500 | 5 | 500 | 260 | 4447 | 2.25 |

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

We claim:

1. A method of forming a SiCOH film layer on a substrate, the method comprising the steps of:
   providing a reaction chamber having at least one substrate disposed therein;
   introducing into the reaction chamber a Si—(CH$_2$)$_n$—Si containing precursor, with n=1 or 2, selected from the group consisting of:

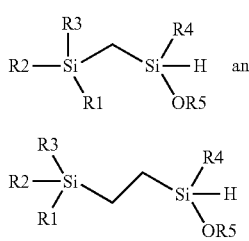

(Formula I, with n = 1)

(Formula 2, with n = 2)

wherein each of R1 through R4 is independently selected from the group consisting of H, methyl, ethyl, propyl, vinyl, and C1-C3 alkoxy; R5 is selected from the group consisting of methyl, ethyl, and propyl;
   introducing into the reaction chamber a vinyl-containing precursor having the formula Si(R1)$_x$(O(R2))$_{4-x}$, wherein at least one R1 is vinyl, an optional second R1 being a hydrogen or an alkyl group; each R2 is independently selected from an alkyl group; and x is 1 or 2; and
   introducing a porogen into the reaction chamber; and
   contacting the Si—(CH$_2$)$_n$—Si precursor, the vinyl-containing precursor, the porogen, and the substrate to form a SiCOH film on at least one surface of the substrate using a deposition process.

2. The method of claim 1, wherein the vinyl-containing precursor is selected from the group consisting of vinyldiethoxysilane, vinyldimethoxysilane, vinyltrimethoxysilane, vinyltriethoxysilane, vinylmethyldimethoxysilane, and vinylmethyldiethoxysilane.

3. The method of claim 2, wherein the vinyl-containing precursor is vinyltriethoxysilane or vinylmethyldiethoxysilane.

4. The method of claim 1, wherein the porogen is substituted or unsubstituted bicyclo[2.2.1]hepta-2,5-diene.

5. The method of claim 1, wherein the deposition process is single frequency PECVD.

6. The method of claim 1, further comprising the step of rendering the SiCOH film porous.

7. The method of claim 1, wherein R1 through R4 is not H.

8. The method of claim 7, wherein the Si—(CH$_2$)$_n$—Si containing precursor is selected from the group consisting of (EtO)$_3$Si—CH$_2$—Si(OEt)$_2$H, Me(OEt)$_2$Si—CH$_2$—Si(OEt)$_2$H, Me(OEt)$_2$Si—CH$_2$—Si(OEt)HMe, Me$_2$(OEt)Si—CH$_2$—Si(OEt)$_2$H, (EtO)Me$_2$SiCH$_2$Si(OMe)$_2$H, Me$_2$(OEt)Si—CH$_2$—Si(OEt)HMe, (OEt)$_3$Si—CH$_2$—Si(OEt)HMe, (EtO)$_3$Si—CH$_2$—Si(OMe)HMe, Me(OMe)$_2$Si—CH$_2$—Si(OMe)$_2$H, Me(OMe)$_2$Si—CH$_2$—Si(OMe)HMe, Me$_2$(OMe)SiCH$_2$Si(OMe)$_2$H, and Me$_2$(OEt)Si—CH$_2$—Si(OMe)HMe.

9. The method of claim 7, wherein the Si—(CH$_2$)$_n$—Si containing precursor is Me(OEt)$_2$Si—CH$_2$—Si(OEt)$_2$H, Me$_2$(OEt)Si—CH$_2$—Si(OEt)$_2$H, or Me(OEt)$_2$Si—CH$_2$—Si(OEt)HMe.

10. The method of claim 7, wherein the Si—(CH$_2$)$_n$—Si containing precursor is selected from the group consisting of (EtO)$_3$Si—CH$_2$CH$_2$—Si(OEt)$_2$H, Me(OEt)$_2$Si—CH$_2$CH$_2$—Si(OEt)$_2$H, Me(OEt)$_2$Si—CH$_2$CH$_2$—Si(OEt)HMe, Me$_2$(OEt)Si—CH$_2$CH$_2$—Si(OEt)$_2$H, (EtO)Me$_2$Si—CH$_2$CH$_2$Si(OMe)$_2$H, Me$_2$(OEt)Si—CH$_2$CH$_2$—Si(OEt)HMe, (OEt)$_3$Si—CH$_2$CH$_2$—Si(OEt)HMe, (EtO)$_3$Si—CH$_2$CH$_2$—Si(OMe)HMe, Me(OMe)$_2$Si—CH$_2$CH$_2$—Si(OMe)$_2$H, Me(OMe)$_2$Si—CH$_2$CH$_2$—Si(OMe)HMe, Me$_2$(OMe)Si—CH$_2$CH$_2$Si(OMe)$_2$H, and Me$_2$(OEt)Si—CH$_2$CH$_2$—Si(OMe)HMe.

11. The method of claim 10, wherein the Si—(CH$_2$)$_n$—Si containing precursor is Me(OEt)$_2$Si—CH$_2$CH$_2$—Si(OEt)$_2$H, Me$_2$(OEt)Si—CH$_2$CH$_2$—Si(OEt)$_2$H, or Me(OEt)$_2$Si—CH$_2$CH$_2$—Si(OEt)HMe.

12. The method of claim 10, wherein the Si—(CH$_2$)$_n$—Si containing precursor is (EtO)$_2$HSi—CH$_2$—SiH(OEt)$_2$.

13. The method of claim 7, wherein the SiCOH film has a dielectric constant that is lower than both (1) a dielectric constant of a SiCOH film formed by the Si—(CH$_2$)$_n$—Si containing precursor and the porogen and (2) a dielectric constant of a SiCOH film formed by the vinyl-containing precursor and the porogen.

14. The method of claim 1, wherein only one of R1 through R3 is H.

15. The method of claim 14, wherein the Si—(CH$_2$)$_n$—Si containing precursor is selected from the group consisting of MeH(OMe)Si—CH$_2$—Si(OMe)HMe, (EtO)$_2$HSi—CH$_2$—Si(OEt)$_2$H, (EtO)HMeSi—CH$_2$—Si(OEt)HMe, and (iPrO)HMeSi—CH$_2$—Si(OiPr)HMe.

16. The method of claim 1, wherein the Si—(CH$_2$)$_n$—Si containing precursor comprises Me$_2$(EtO)Si—CH$_2$—SiH(OEt)$_2$, the vinyl containing precursor comprises vinyltriethoxysilane and the porogen is substituted or unsubstituted bicyclo[2.2.1]hepta-2,5-diene.

17. The method of claim 1, wherein the deposition process is chemical vapor deposition.

* * * * *